United States Patent [19]

Suguro

[11] Patent Number: 4,912,542
[45] Date of Patent: Mar. 27, 1990

[54] SEMICONDUCTOR DEVICE AND METHOD OF MANUFACTURING THE SAME

[75] Inventor: Kyoichi Suguro, Yokohama, Japan

[73] Assignee: Kabushiki Kaisha Toshiba, Kawasaki, Japan

[21] Appl. No.: 156,929

[22] Filed: Feb. 17, 1988

[30] Foreign Application Priority Data

May 12, 1987 [JP] Japan .................. 62-115354

[51] Int. Cl.$^4$ .................. H01L 23/48; H01L 29/44; H01L 29/12; B32B 15/04
[52] U.S. Cl. .................. 357/67; 428/620; 428/627
[58] Field of Search .................. 357/67; 428/620, 627

[56] References Cited

U.S. PATENT DOCUMENTS 4,180,596 12/1979 Crowder et al. .................. 357/67
4,502,207 3/1985 Ohshima et al. .................. 428/620

FOREIGN PATENT DOCUMENTS 55-121667 9/1980 Japan .
55-165680 12/1980 Japan .

Primary Examiner—Eugene R. Laroche
Assistant Examiner—Michael Shingleton
Attorney, Agent, or Firm—Oblon, Spivak, McClelland, Maier & Neustadt

[57] ABSTRACT

Disclosed is a semiconductor device having a metal-silicon alloy wiring layer and a structure wherein a metal compound, having a larger free energy decrease caused by compound formation, than a free energy decrease caused by the metal-silicon alloy formation, is precipitated. A method of fabricating the semiconductor device having the above microstructure is also disclosed. In the semiconductor device, the grain boundaries are micronized by precipitation of a metal compound, thus the mechanical strength can be improved, and the circuit reliability can also be improved. Further, an increase in resistance can be suppressed by precipitation of the metal compound.

15 Claims, 2 Drawing Sheets

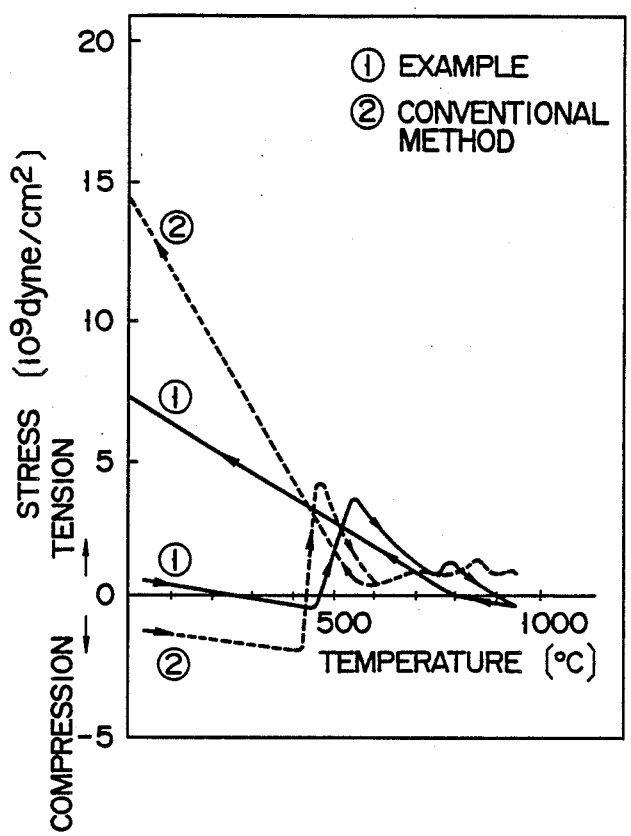
F I G. 3

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same and, more particularly, to a micro structure of a wiring layer and a method of forming the same.

2. Description of the Prior Art

A refractory or high-melting-point metal wiring is required in recent semiconductor devices due to the process requirements. In order to satisfy such needs, polycrystalline silicon has been used for a wiring layer. However, a metal-silicon alloy is recently used because it has a smaller resistivity than that of polycrystalline silicon. The small resistivity can improve electrical characteristics of the wiring layer. The metal-silicon alloy in this specification includes a metal silicide and a metal-silicon eutectic alloy. The metal silicides include a eutectic alloy of a metal and a metal silicide, and a eutectic alloy of a metal silicide and silicon. Typical metal silicides are $MoSi_x$, $WSi_x$, $TiSi_x$, and the like. A typical metal-silicon eutectic alloy is a eutectic alloy of Al-Si.

A wiring layer of a metal-silicon alloy has a disadvantage of a large thermal expansion rate. For example, the thermal expansion rate of the metal silicide corresponds to a coefficient of linear expansion of 10 ppm/K or more. This coefficient of linear expansion is greatly larger than that (0.5 to 0.6 ppm/K) of the $SiO_2$ film serving as the underlayer of the wiring layer. For this reason, when a heat cycle test in the temperature range of room temperature to 900° C. or higher is performed, thermal stress generated between the metal silicide wiring layer and the $SiO_2$ underlayer is $10^{10}$ dyne/cm$^2$ or more. As a result, the thermal stress is concentrated in a step portion of the underlayer and this portion is subjected to an electrical disconnection, peeling, or cracks. The same phenomenon as described above occurs in the metal-silicon eutectic alloy.

A metal-silicon alloy wiring layer is rarely used as a single layer. A two-layered structure is employed wherein a polycrystalline silicon layer is formed between the $SiO_2$ underlayer and the metal-silicon alloy wiring layer due to the following reasons. First, polycrystalline silicon has a thermal expansion rate as an intermediate value between the thermal expansion rates of the upper and lower layers sandwiching the polycrystalline silicon layer, and the thermal stress can be reduced by interposed polycrystalline silicon. Second, even if the metal-silicon alloy wiring layer as the upper layer is electrically disconnected by the thermal stress, the wiring function can be maintained by the polycrsytalline silicon layer formed under the metal-silicon layer. As a result, crucial failure which hinders the functioning of the device, can be avoided.

Micropatterning of elements has been developed and a wiring layer width is reduced to 1 μm or less. It becomes apparent that the two-layered structure cannot satisfactorily compensate for the disadvantages of the metal-silicon alloy. In a micropatterned metal-silicon alloy wiring layer, disconnections frequently occur due to the above reason. Even if the wiring function can be maintained by the underlying polycrystalline silicon layer, a wiring resistance is undesirably increased. Therefore, it is very important to increase the strength of the metal-silicon wiring layer and to prevent electrical disconnections.

An increase in metal-silicon alloy wiring disconnections by micropatterning may be caused by a decrease in grain boundaries in the wiring layer and concentration of the thermal stress in the reduced grain boundaries. In fact, in a metal-silicide wiring, when the wiring width is decreased to 1 μm or less, only one or two grains are present in the widthwise direction. Therefore, the grain boundaries of the metal silicide cross the wiring layer.

It is known to those skilled in the art that the mechanical strength of a metal silicide can be improved by adding Si thereto because excess silicon is precipitated in the grain boundaries, the grain size becomes smaller and the grain boundaries are increased. The stress acting on the grain boundaries can be uniformly distributed to the entire layer. However, this method cannot be employed to eliminate the above drawback due to the following reasons. First, in order to reduce the stress acting on the metal silicide wiring to $10^{10}$ dyne/cm$^2$ or less according to this method, the content of the silicon component must be three times that of the metal component, and the resistivity is greatly increased. Second, the eutectic point of metal silicide-silicon is as low as 1,230° C. or less. In general, the grain boundaries of the eutectic crystal are activated at a temperature corresponding to 60 to 70% of the eutectic point, i.e., 850° to 1,000° C., and atomic transfer occurs. The wiring of the metal-silicide silicon eutectic alloy is subjected to annealing by heating in the temperature cycle test, and the grain boundaries are changed or disappear. Therefore, the properties of the wiring layer may be degraded.

SUMMARY OF THE INVENTION

It is a first object of the present invention to decrease a crystal grain size of a metal-silicon alloy wiring layer to increase mechanical strength of the wiring layer while an increase in resistivity is kept low, thereby preventing electrical disconnections.

Preferably, an effective expansion coefficient of the metal-silicon alloy wiring layer is decreased, and the thermal stress acting on the wiring layer is reduced, thereby improving reliability of the wiring layer.

More preferably, the grain boundaries of the metal-silicon alloy wiring layer are stabilized, and degradation caused by the heat cycle test is prevented.

It is a second object of the present invention to provide a method of manufacturing a semiconductor device having a highly reliable wiring layer with the structure described above.

In order to achieve the first object of the present invention, there is provided a semiconductor device having a metal-silicon alloy wiring layer and a structure wherein a metal compound having a larger free energy decrease caused by compound formation than a free energy decrease caused by the metal-silicon alloy formation is precipitated at grain boundaries of the metal-silicon alloy.

In order to achieve the second object of the present invention, there is provided a method of manufacturing a semiconductor device prepared by forming a metal-silicon alloy film on a semiconductor wafer and patterning the film in a desired pattern to form a desired wiring layer, wherein an element constituting a metal compound is added during or after formation of the metal-silicon alloy film, the element having a free energy decrease caused by compound formation in the metal-silicon alloy film larger than a free energy decrease caused by the metal-silicon alloy formation and also having a resistivity smaller than that of undoped silicon, and thereafter the metal compound is precipitated at grain boundaries of the metal-silicon alloy.

BRIEF DESCRIPTION OF THE DRAWINGS

FIG. 3 is a graph showing thermal stress between the wiring layer and the substrate of an example of the present invention as compared with a conventional example.

DETAILED DESCRIPTION OF THE PREFERRED EMBODIMENT

Figure 1:
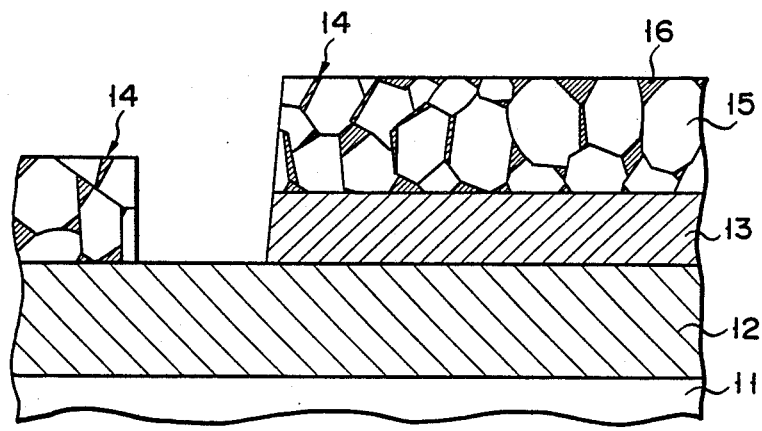
FIG. 1 is a sectional view for explaining a preferred embodiment of a semiconductor device according to the present invention.

A preferred embodiment of a semiconductor device according to the present invention will be described with reference to FIG. 1. Referring to FIG. 1, reference numeral 11 denotes a silicon substrate having an impurity region in which elements such as a transistor are formed. $SiO_2$ film 12 as an insulating interlayer is formed on silicon substrate 11. A two-layered wiring structure of polycrystalline silicon layer 13 and metal-silicon alloy layer 14 is formed on $SiO_2$ layer 12. Metal-silicon alloy layer 14 has a micro structure in which metal compound 16 is precipitated at the boundaries of crystal grains 15 of the metal-silicon alloy. Micro grain boundaries are formed in metal-silicon layer 14 by precipitation of metal compound 16, and the stress can be uniformly distributed. Therefore, the mechanical strength of metal-silicon alloy layer 14 can be increased, and wiring disconnections can be greatly reduced.

Metal components of metal-silicon alloy grains 15 may be Ti, Zr, Hf, Nb, Ta, Cr, Mo, W, or Al. Of these metals, aluminum cannot be converted into a silicide. An Al-Si alloy is a eutectic alloy of aluminum and silicon crystals. The remaining metals can be converted into stable silicides. Even if a stable silicide is formed, the corresponding alloy is rarely made of only a pure silicide. Most alloys are a eutectic alloy of a metal and a metal silicide or a eutectic alloy of a metal silicide and silicon in accordance with the fact that a starting system is metal rich or silicon rich.

A metal component of metal compound 16, precipitated at the boundaries of the metal-silicon alloy, may be a metal which forms metal-silicon alloy grains 15 or may be any other metal. There are two absolute conditions imposed on metal compound 16.

According to the first condition, a free energy decrease caused by the compound formation is larger than that caused by the metal-silicon alloy formation. When the free energy decrease caused by compound formation is large, the thermodynamic stability of the compound can be improved, and the compound can be easily formed in an equilibrium state. When the first condition is satisfied, the metal compound can be precipitated at the boundaries of the metal-silicon alloy. However, when the first condition cannot be satisfied, the following phenomenon occurs. Even if precipitation phase 16 is formed in a non-equilibrium state such as rapid cooling, the precipitation phase disappears in a heat cycle test or the like. Examples of the meal compound satisfying the first condition are boride, nitride, carbide, phosphide and the like of the metal constituting metal-silicon alloy grains 15. If the first condition is satisfied, an intermetallic compound may be used.

A free energy change during formation of $MoSi_2$, $WSi_2$, or $TiSi_2$ is about $-8$ to $-10$ kcal/g·atom. Examples of the metal compounds having a larger free energy decrease during formation of the compound than this are as follows (at 950° C.):

$TiB_2$: 24.5 kcal/g·atom
TiC: 20.3 kcal/g·atom
TiN: 26.5 kcal/g·atom
TaN: 22.0 kcal/g·atom The free energy decrease during the formation of an Al-Si eutectic alloy is several kcal/g·atom. Examples of the metal compound having a larger free energy decrease during the formation of the compound than this are as follows (at 470° C.):

$TiB_2$: 25.0 kcal/g·atom
$TaB_2$: 16.1 kcal/g·atom
TiC: 20.9 kcal/g·atom
TiN: 32.3 kcal/g·atom According to the second condition imposed on metal compound 16, its resistivity must be smaller than that of undoped silicon. If the second condition is not satisfied, the wiring resistance is greatly increased. Therefore, no advantages can be obtained as compared with the conventional method of adding an excess of silicon in a metal silicide.

The resistivity of an undoped silicon is larger than 5 to 10 $\Omega$·cm. The resistivities of the metal compounds listed above are very smaller than that of undoped silicon. Therefore, the above compounds satisfy the second condition as follows:

$TiSi_2$: 14 to 17 $\mu\Omega$·cm
$TiB_2$: 20 $\mu\Omega$·cm
TiC: 60 $\mu\Omega$·cm
TiN: 40 $\mu\Omega$·cm
TaN: 198 $\mu\Omega$·cm The thermal expansion rate of metal compound 16 precipitated at the grain boundaries, is preferably smaller than that of the metal-silicon alloy. This advantageously allows a decrease in the effective thermal expansion rate of the entire wiring layer. Of the metal compounds satisfying the first and second conditions, the following compounds have smaller coefficients of linear expansion than those of $MoSi_2$ (12.5 ppm/k), $WSi_2$ (12 ppm/k), and $TiSi_2$ (14.5 ppm/k):

$TiB_2$: 4.6 ppm/k
TiC: 8 ppm/k
TiN: 9.4 ppm/k
TaN: 3 to 3.6 ppm/k

For this reason, the stress acting on the wiring layer in a preferred embodiment can be greatly decreased. Metal-silicon alloy layer 14 can be used as a wiring layer without forming polycrystalline silicon layer 13 thereunder.

The melting point of metal compound 16 precipitated at the grain boundaries, is preferably higher than the melting or eutectic point of the metal-silicon alloy. Atomic transfer of the matrix phase can be prevented due to the presence of stable refractory compound 16. More specifically, metal compound 16 improves its stability of the grain boundaries, and degradation caused by the heat cycle test can be prevented. Of the metal compounds satisfying the first and second conditions, the following compounds have higher melting points than those of $MoSi_2$ (2,030° C.), $WSi_2$ (2,165° C.), and $TiSi_2$ (1,540° C.):

TiB$_2$: 2,790° C.
TiC: 3,257° C.
TiN: 2,950° C.
TaN: 3,090° C.

The present invention is applicable to wiring layers of any semiconductor devices. In particular, the present invention is very effective as a wiring layer formed on a field insulating film in a field region.

The following means can be used as methods for adding a metal compound component precipitated at the grain boundaries.

According to the first means, a metal compound component is added when a metal-silicon alloy film is formed on a surface of a semiconductor wafer. The metal-silicon alloy film is generally formed by sputtering. When a desired element component is contained in a sputtering target, the desired component can be added to the metal-silicon alloy film upon its formation. This means is very effective when the metal component of the metal compound to be precipitated at the grain boundaries is different from that of the metal-silicon alloy;

According to a second means, a desired component is added by ion implantation or the like after a metal-silicon alloy film is formed on a surface of a semiconductor wafer. This means is very effective when the metal component of the metal compound precipitated at the grain boundaries is the same as that of the metal-silicon alloy. If the component to be ion-implanted is boron or phosphorus, its concentration must be higher than that implanted in source and drain regions in a MOS semiconductor device.

The present invention will be described in detail by way of its examples.

EXAMPLE 1

Figure 2A:
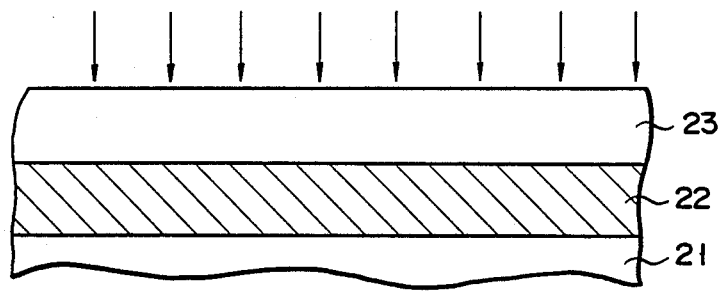
FIGS. 2A and 2B are sectional views for explaining the main steps in one embodiment according to a method of the present invention.

As shown in FIG. 2A, 2,000-Å thick thermal oxide film 22 was formed on a surface (100) of silicon substrate 21. A composite target of Ti and Si was used in Ar$^+$ ion sputtering to form 3,000-Å thick TiSi$_{3.2}$ alloy film 23. In this case, vacuum pressures before and after the Ar supply were $1 \times 10^{-7}$ Torr and $3.8 \times 10^{-3}$ Torr, respectively. A sputtering rate was 1,300 to 1,400 Å/min.

BF$_2^+$ ions were implanted in Ti-Si alloy film 23 at an acceleration energy of 135 keV and a dose of $1 \times 10^{16}$ cm$^{-2}$. The depth of ion implantation was about 700 Å.

Figure 2B:
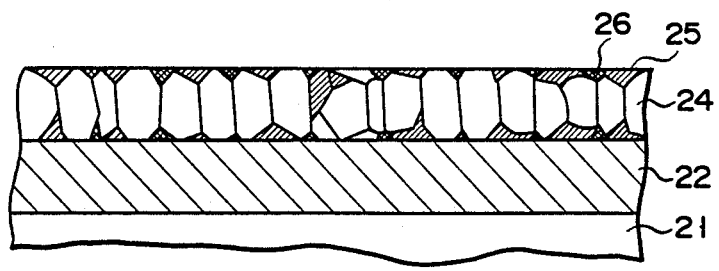

The resultant structure was annealed at 950° C. and a microstructure shown in FIG. 2B was formed in Ti-Si alloy film 23. Reference numeral 24 in FIG. 2B denotes TiSi$_2$ crystal grains; and reference numeral 25, Si crystal grains. TiB$_2$ 26 was precipitated at grain boundaries of the Ti-Si eutectic alloy, thereby constituting the microstructure of the present invention. Thereafter, the Ti-Si eutectic alloy was etched in a desired pattern, and the desired wiring layer was formed.

A wiring layer was formed as a comparative example following the same procedures as described above, except that BF$_2^+$ ions were not implanted. The microstructure of the wiring layer of the comparative example is different from that of Example 1 in that TiSi$_2$ 26 is not precipitated.

A resistivity of a wiring having 10,000 steps each having a height of 0.5 μm in a semiconductor device of Example 1, was measured to be 26 μΩ·cm (increase rate: 5% with respect to TiSi$_{3.2}$), and that in the comparative example was 50 μΩ·cm (increase rate: 100%).

The resistivity of Example 1 is kept low since the resistivity of TiB$_2$ 26 is smaller than that of silicon.

A heat cycle test of semiconductor devices of Example 1 and the comparative example was performed at the temperature ranging from room temperature to 950° C. Stresses between the Ti-Si wiring layer and the SiO$_2$ film at the respective temperatures were measured, and the results are shown in FIG. 3. Curves ① indicate the results of Example 1, while curves ② indicate the results of the comparative example. As is apparent from FIG. 3, the temperature gradient of the thermal stress in Example 1 is $1 \times 10^7$ dyne/cm$^2$·k, only 40% of that in the comparative example, i.e., $2.5 \times 10^7$ dyne/cm$^2$·k. The stress in the comparative example at room temperature is $1.4 \times 10^{10}$ dyne/cm$^2$, while that in Example 1 is greatly decreased to $4.0 \times 10^9$ dyne/cm$^2$. The thermal stress in Example 1 is much smaller than that in the comparative example because the thermal expansion rate of TiB$_2$ 26 is substantially smaller than that of silicon so as to decrease the effective thermal expansion rate of the entire wiring layer, as described above.

In the above embodiment, the dose was $1 \times 10^{16}$ cm$^{-2}$. It is preferable to use the dose higher than $1 \times 10^{15}$ cm$^{-2}$. The dose $1 \times 10^{15}$, $1 \times 10^{16}$ cm$^{-2}$ respectively correspond to the impurity concentration $1 \times 10^{20}$ cm$^{-3}$, $1 \times 10^{21}$ cm$^{-3}$. BF$^+$, BN$^+$ or B$^+$ etc. may be adopted instead of BF$_2^+$.

EXAMPLE 2

A semiconductor device was fabricated following the same procedures as in Example 1, except that BF$_3$ and Ar were used during sputtering in place of BF$^+_2$ ion implantation of Example 1 in order to form TiSi$_{3.2}$ film 23 and 1.3% of boron were added to TiSi$_{3.2}$ film 23 during its formation. A heat cycle test of the resultant semiconductor device was performed following the same procedures as in Example 1. A stress after annealing was $5 \times 10^9$ dyne/cm$^2$, which demonstrates the same effect as in Example 1.

The same effect could have been obtained when N$_2$ was added in place of B during sputtering and a eutectic alloy consisting of TiSi$_2$, Si and TiN was formed.

The same effect was also obtained when either C or P was used in place of B during sputtering.

EXAMPLE 3

A 8,000- thermal oxide film was formed on a surface (100) of a silicon substrate. An Al+1%Si+2%TiB$_2$ alloy target was sputtered using Ar$^+$ ions to form a 0.6-μm thick Al-Si-Ti-B alloy film. Vacuum pressures before and after Ar supply were $1 \times 10^{-8}$ Torr and $2.5 \times 10^{-3}$ Torr, respectively. A sputtering rate was 1,200 Å/min.

The resultant Al-Si-Ti-B alloy film was annealed in a 450° C. N$_2$ atmosphere containing 10% of H$_2$, and a tensile stress which was $2 \times 10^{+8}$ dyne/cm$^2$ and was decreased to 1/5 of $1 \times 10^9$ dyne/cm$^2$ of the Al-1%Si alloy film. A resistivity of the entire Al-Si-Ti-B film was increased by 10%, i.e., to 3.0 μΩ·cm as compared with 27.7 μΩ·cm of the Al-1%Si alloy film. However, the wiring resistance of the Al-Si-Ti-B alloy film formed on a structure having 10,000 steps each having a height of 0.5 μm was as low as 3.2 μΩ·cm as compared with that (4.0 μΩ~cm) of the Al-Si alloy film. It is apparent that the Al-Si-Ti-B film is effective when the stress concentrated by steps is great. Even after a 0.5-μm thick PSG film and a 0.05-μm thick SiN film were formed, stress migration was suppressed, and wiring disconnections were reduced to about 1/10. TiB$_2$ was precipitated at the grain boundaries of Al-Si alloy in the Al-Si-Ti-B film and the grain boundaries were found to be stabilized.

According to the present invention as described in detail above, the grains can be micronized to increase the mechanical strength, while the increase in resistance of the wiring in the semiconductor device can be avoided. In addition, the effective thermal expansion rate of the wiring can be reduced, and the grain boundaries can be stabilized so as to prevent degradation. Many of these advantages can be obtained in order to improve reliability.

What is claimed is:

1. A semiconductor device, comprising a wiring layer formed mainly of metal-silicon alloy and including, throughout the thickness direction thereof, a metal compound precipitated at grain boundaries of the metal-silicon alloy, said metal compound miniaturizing the grain boundaries, said metal compound having a larger free energy decrease caused by formation of said metal compound then a free energy decrease caused by formation of said metal-silicon alloy, and having a melting point "higher than that" of the metal-silicon alloy.

2. A device according to claim 1, wherein a thermal expansion coefficient of said metal compound is smaller than that of the metal-silicon alloy.

3. A device according to claim 1, wherein said metal-silicon alloy is a metal silicide.

4. A device according to claim 3, wherein a metal component constituting the metal-silicon alloy is an element selected from the group consisting of Ti, Zr, Hf, Nb, Ta, Cr, Mo, and W.

5. A device according to claim 1, wherein said metal-silicon alloy is a metal-silicon eutectic alloy.

6. A device according to claim 5, wherein a metal component constituting said metal-silicon eutectic alloy is Al.

7. A device according to claim 5, wherein a metal component of said metal compound is different from that of said metal-silicon alloy.

8. A device according to claim 5, wherein the metal compound is a compound selected from the group consisting of a metal boride, a metal nitride, a metal carbide and a metal phosphide, said metal is selected from the group consisting of Ti, Zr, Hf, Nb, Ta, Cr, Mo and W.

9. A device according to claim 1, wherein said metal compound is an intermetallic compound.

10. A device according to claim 1, wherein said wiring layer has a two-layered structure formed of a polycrystalline silicon layer and a metal-silicon alloy layer formed thereon.

11. A device according to claim 1, wherein said wiring layer consists of only said metal-silicon alloy and including, throughout the thickness direction thereof, a metal compound precipitated at grain boundaries of the metal-silicon alloy, said metal compound minaturizing the grain boundaries, said metal compound having a larger free energy caused by formation of said metal compound than a free energy decrease caused by formation of said metal-silicon alloy, and having a melting point higher than that of the metal-silicon alloy.

12. A device according to claim 1, wherein said wiring layer is formed on a field insulating film.

13. A device according to claim 3, wherein said metal compound is a compound selected from the group consisting of a metal boride, a metal nitride, a metal carbide and a metal phosphide, said metal is selected from the group consisting of Ti, Zr, Hf, Nb, Ta, Cr, Mo and W.

14. A device according to claim 3, wherein a metal component of said metal compound is the same as that of said metal silicide.

15. A device according to claim 3, wherein a metal component of said metal compound is different from that of said metal silicide.

* * * * *